United States Patent
Su et al.

(10) Patent No.: US 8,211,597 B2
(45) Date of Patent: Jul. 3, 2012

(54) COLOR PHOTORESIST WITH GOLD NANOPARTICLES AND COLOR FILTERS MADE THEREBY

(75) Inventors: Wei-Fang Su, Tainan County (TW); Chien-Chih Lin, Tainan County (TW); I-Shuo Liu, Tainan County (TW)

(73) Assignee: Chimei Innolux Corporation, Miao-Li County (TW)

( * ) Notice: Subject to any disclaimer, the term of this patent is extended or adjusted under 35 U.S.C. 154(b) by 1056 days.

(21) Appl. No.: 12/137,686

(22) Filed: Jun. 12, 2008

(65) Prior Publication Data

US 2008/0311488 A1    Dec. 18, 2008

(51) Int. Cl.
*G03F 1/00* (2006.01)
*G03F 7/004* (2006.01)
*B22F 9/20* (2006.01)

(52) U.S. Cl. ............ 430/7; 430/281.1; 75/362; 977/810
(58) Field of Classification Search .................. None
See application file for complete search history.

(56) References Cited

U.S. PATENT DOCUMENTS

| 6,858,372 B2 * | 2/2005 | Whitlock et al. ........... 430/270.1 |
| 6,929,675 B1 * | 8/2005 | Bunge et al. .................... 75/362 |
| 2007/0020564 A1 * | 1/2007 | Wu ............................... 430/311 |
| 2008/0245186 A1 * | 10/2008 | Yang et al. ...................... 75/362 |

FOREIGN PATENT DOCUMENTS

WO    WO-2007-113107    * 10/2007

OTHER PUBLICATIONS

Green, M. and O'Brien, P.; "A Simple One Phase Preparation of Organically Capped Gold Nanocrystals;" The Journal of the Royal Society of Chemistry; 2000, pp. 183-184.

* cited by examiner

*Primary Examiner* — Cynthia Kelly
*Assistant Examiner* — Anna Verderame
(74) *Attorney, Agent, or Firm* — Thomas|Kayden

(57) ABSTRACT

A color photoresist with gold nanoparticles and color filters made therefrom are provided. The color photoresist with gold nanoparticles includes substituted acrylate monomers, gold nanoparticles (or clusters), surfactants and a photo-polymerization initiator. The color filter includes a polyacrylate, gold nanoparticles (or clusters) and surfactants. The gold nanoparticles (or clusters) can be dispersed in the color photoresist or the color filter by the surfactants.

19 Claims, 5 Drawing Sheets

COLOR PHOTORESIST WITH GOLD NANOPARTICLES AND COLOR FILTERS MADE THEREBY

RELATED APPLICATIONS

This application claims priority to Taiwan Application Serial Number 96121419, filed Jun. 13, 2007, which is herein incorporated by reference.

BACKGROUND

1. Field of Invention

The present invention relates to a color photoresist. More particularly, the present invention relates to a color photoresist with gold nanoparticles.

2. Description of Related Art

Color filters have a variety of applications such as charge coupled device (CCD), line sensor, liquid crystal display (LCD), and organic light emitting display (OLED). As the need for these products grows, so does the demand for color filters. Color filters play an important role in achieving optimal visual effects in color displays such as the thin film transistor liquid crystal display (TFT LCD). The key factor affecting the visual effects of color filters is the color purity of the red/green/blue filter. The higher the color purity, the more colors could be displayed.

Currently, color filters are generally manufactured by the pigment dispersion method. Color filters manufactured by such process have better light resistance and heat resistance. However, the color purity of the color filtering layer formed on the glass substrate is determined by the pigment of the photoresist. Generally, the color purity of the photoresist could be increased by raising the quantity of the pigment. Nevertheless, excessive quantity of the pigment would not increase the color purity. Furthermore, excessive quantity of the pigment would result in pigment disposition, which would in turn decrease the light transmittance of the photoresist. The problem of pigment disposition is more crucial in pigment of larger particle size. In view of the foregoing, there is a need to provide a color photoresist having better color purity and without additive disposition.

SUMMARY

In one aspect of the present invention, a red photoresist with gold nanoparticles is provided. The red photoresist comprises acrylate monomers, a photo-polymerization initiator, gold nanoparticles, a first organic surfactant, and a second organic surfactant. The photo-polymerization initiator is mixed with the acrylate monomers. The gold nanoparticles have a size from approximately 3 nm to approximately 50 nm. Each molecule of the first organic surfactant and the second organic surfactant has a terminal heteroatom group and at least one linear alkyl group. The terminal heteroatom group binds to the surfaces of the gold nanoparticles, and the linear alkyl group disperses the gold nanoparticles within the acrylate monomers and the photo-polymerization initiator.

In another aspect of the present invention, a blue photoresist with gold nanoparticles is provided. The blue photoresist comprises acrylate monomers, a photo-polymerization initiator, gold nanoparticle clusters, and an organic surfactant. The photo-polymerization initiator is mixed with the acrylate monomers. The gold nanoparticle clusters have a size from approximately 200 nm to approximately 500 nm. Each molecule of the organic surfactant has a terminal heteroatom group and at least three linear alkyl groups. The terminal heteroatom group binds to the surfaces of the gold nanoparticle clusters, and the linear alkyl groups disperse the gold nanoparticle clusters in the acrylate monomers and the photo-polymerization initiator.

In another aspect of the present invention, a red filter with gold nanoparticles is provided. The red filter is made from the red photoresist of the previous embodiment of the present invention. The red filter comprises polyacrylate, gold nanoparticles, a first organic surfactant and a second organic surfactant. The gold nanoparticles have a size from approximately 3 nm to approximately 50 nm. Each molecule of the first organic surfactant and the second organic surfactant has a terminal heteroatom group and at least one linear alkyl group. The terminal heteroatom group binds to the surfaces of the gold nanoparticles, and the linear alkyl group disperses the gold nanoparticles within the polyacrylate.

In another aspect of the present invention, a blue filter with gold nanoparticle clusters is provided. The blue filter is made from the blue photoresist of the previous embodiment of the present invention. The blue filter comprises polyacrylate, gold nanoparticle clusters, and an organic surfactant. The gold nanoparticle clusters have a size from approximately 200 nm to approximately 500 nm. Each molecule of the organic surfactant has a terminal heteroatom group and three linear alkyl groups. The terminal heteroatom group binds to the surfaces of the gold nanoparticle clusters. The linear alkyl groups disperse the gold nanoparticle clusters in the polyacrylate.

In yet another aspect of the present invention, a method for preparing a red photoresist with gold nanoparticles is provided. According to one embodiment of this aspect, the method comprises the following steps. A gold salt is dissolved in an alkyl phosphate solvent thereby forming a solution. A first organic surfactant is added into the solution. A reducing agent is added into the solution and the gold salt is reduced to gold nanoparticles under an inert gas. According to another embodiment of this aspect, the method further comprises adding a second organic surfactant into the solution before adding the reducing agent.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
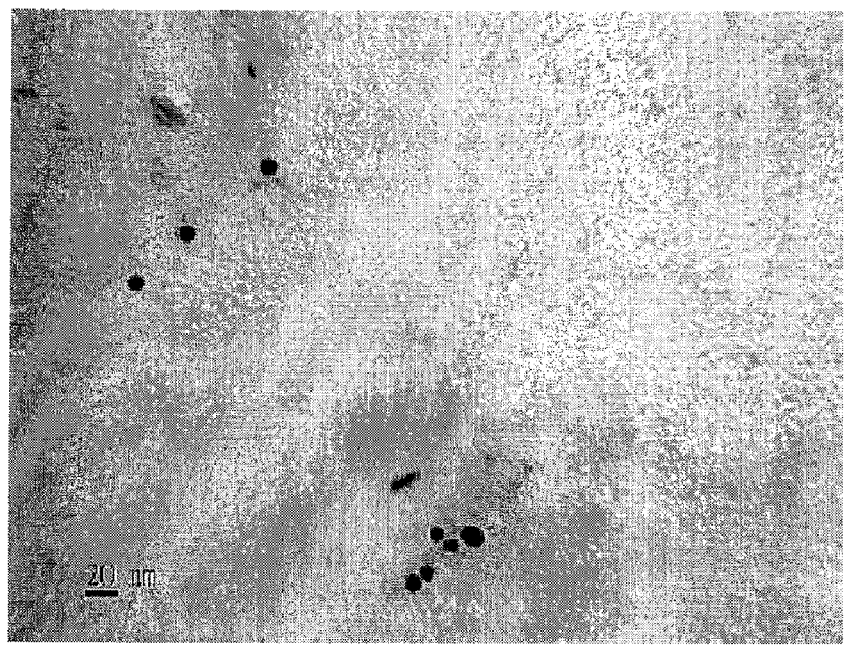
FIG. 1 is an electron microscope photograph illustrating a gold nanoparticle-containing toluene solution of one example of the present invention (Table 1, Example E)

Ancient artifacts exhibit splendid colors. The metallic nanoparticles such as gold nanoparticles and silver nanoparticles in the material of these artifacts are responsible for such phenomenon. Such phenomenon is caused by the surface plasmon resonance (SPR) of the metallic nanoparticles. Surface plasmons are surface electromagnetic waves that propagate parallel along a metal/dielectric (or metal/vacuum) interface. Surface plasmons are excited by light or electrons and would oscillate under the action of the electromagnetic field. For nanoparticles, localized surface plasmon oscillations can give rise to the intense colors of solutions of plasmon resonance nanoparticles and/or very intense scattering.

Gold nanoparticles having the size of about 3 nm to approximately 30 nm would allow red light to transmit therethrough, while gold nanoparticles having the size of about 300 nm to approximately 500 nm would allow blue light to transmit therethrough. Such gold nanoparticles are good substitutes for known pigments to be mixed in the material of the photoresist to form red photoresists and blue photoresists. However, the material of the photoresist is generally an organic material such as high molecular resin. Hence, it is difficult to evenly mix the inorganic gold nanoparticles with the organic material of the photoresist. Therefore, there is no suitable method to use the gold nanoparticles as substitutes for the known pigment for forming a red photoresist and a blue photoresist.

In view of the foregoing, color photoresists with nanoparticles are provided. The color photoresists with nanoparticles according to the embodiments of the present invention do not exhibit the above-mentioned problems, namely the unevenly distribution, aggregation and disposition of nanoparticles within the high molecular resin.

Reference will now be made in detail to the present embodiments of the invention, examples of which are illustrated in the accompanying drawings. Wherever possible, the same reference numbers are used in the drawings and the description to refer to the same or like parts.

According to one embodiment of the present invention, a method for manufacturing gold nanoparticles is provided. A gold salt is dissolved in an alkyl phosphate solvent thereby forming a solution. A first organic surfactant is added into the solution. A reducing agent is added into the solution and the gold salt is reduced to gold nanoparticles under an inert gas. According to the method of this embodiment, when the gold ions are reduced into gold atoms by the reducing agent, the electron cloud of the heteroatom group of the organic surfactant in the solution would act upon the surfaces of gold nanoparticles. Therefore, by altering the organic solvent used, gold nanoparticles or gold nanoparticle clusters of different sizes could be obtained. The organic surfactants bound to the surfaces of the gold nanoparticles have hydrophobic terminals that could bind with the organic solvent so that the gold nanoparticles are dispersed in the organic solvent. The equivalent ratio of the reducing agent to the gold ion is greater than 1:1.

The organic solution containing gold nanoparticles is then mixed with acrylate monomers. The hydrophobic terminals of the surfactant bound to the surfaces of the gold nanoparticles make the gold nanoparticles soluble in acrylate monomers, thereby mixing the gold nanoparticles with acrylate monomers uniformly. After removing the organic solvent, a photo-polymerization is carried out so that a red or blue acrylic photoresist film could be obtained. The red or blue photoresist film could be used as a color filter. A photo-polymerization initiator is used during the above-mentioned photo-polymerization process.

Therefore, the red or blue acrylic photoresist with gold nanoparticles according to the present invention comprises acrylate monomers, gold nanoparticles, surfactant, and photo-polymerization initiator. The gold nanoparticles are dispersed in the acrylate monomers by the surfactant so that only a red light or only a blue light could pass through the acrylic photoresist. Hence, the red or blue photoresist could be used to manufacture a red filter or a blue filter.

The size of the gold nanoparticles of the red photoresist is about 3 nm to approximately 50 nm. The organic surfactants used in the reduction reaction comprise $C_{12}$-$C_{20}$ linear alkyl amine and $C_6$-$C_{12}$ tri(linear-alkyl)l phosphine oxide.

The size of the gold nanoparticle clusters of the blue photoresist is about 200 nm to approximately 500 nm. The organic surfactant used in the reduction is $C_6$-$C_{12}$ Tri(linear-alkyl) groups phosphine oxide.

Less than about 1 percent by weight of gold nanoparticles (clusters) is sufficient to form a red or blue photoresist. In certain examples of the present invention, the quantity of gold nanoparticles (clusters) in the photoresist is preferably about 0.05-0.5 percent by weight. By contrast, the quantity of the pigment used in the prior art is more than 10 percent by weight which is far more than the quantity of gold nanoparticles (clusters) used in the embodiment of the present invention. In this way, the conventional problem of pigment disposition could be solved. Furthermore, since the quantity of gold nanoparticles (clusters) is small, the gold nanoparticles (clusters) would barely affect the property of the photoresist itself.

Embodiment I

Reducing Gold Ions to Form Gold Nanoparticles for Red Photoresist

In this embodiment, following steps were performed so that the gold ions are reduced into gold atoms:

(a) $HAuCl_4 \cdot 3H_2O$ (hydrogen tetrachloroaurate(III), trihydrate) was dissolved in tri-n-butylphosphine (TBP);

(b) tri-n-octylphosphine oxide (TOPO), hexadecylamine (HDA), and sodium borohydride ($NaBH_4$) were added into a reaction flask filled with nitrogen or argon under stirring and heated to 190° C.;

(c) the TBP solution from step (a) was added into the reaction flask of step (b) under stirring thereby producing a solution of dark red, the reaction flask was kept at 190° C. for tens of minutes and then naturally cooled to 90° C.;

(d) toluene was added into the reaction flask of step (c) so that the gold nanoparticles formed were extracted into toluene.

There were eight examples (Examples A-H) conducted according to the method of this embodiment. The final toluene solution systems obtained according to these examples are all dark red. Table 1 shows the quantity of each material used in these examples.

TABLE 1

| Example | TOPO (g) | HDA (g) | $NaBH_4$ (g) | $HAuCl_4 \cdot 3H_2O$ (mg) | TBP (mL) | Toluene (mL) |
|---|---|---|---|---|---|---|
| A | 6.0 | 3.4 | 0.200 | 38.8 | 1.5 | 20 |
| B | 3.0 | 3.0 | 0.200 | 42.8 | 1.5 | 20 |
| C | 1.5 | 3.0 | 0.200 | 37.2 | 1.5 | 20 |
| D | 3.0 | 1.5 | 0.200 | 32.7 | 1.5 | 20 |
| E | 1.5 | 1.5 | 0.200 | 34.6 | 1.5 | 20 |
| F | 1.0 | 1.0 | 0.200 | 31.3 | 1.5 | 20 |
| G | 0.5 | 0.5 | 0.200 | 33.0 | 1.5 | 20 |
| H | 1.2 | 1.2 | 0.175 | 32.1 | 1.5 | 20 |

In Example E, 34.6 mg of $HAuCl_4 \cdot 3H_2O$ was dissolved in 1.5 mL of TBP.

Figure 2:
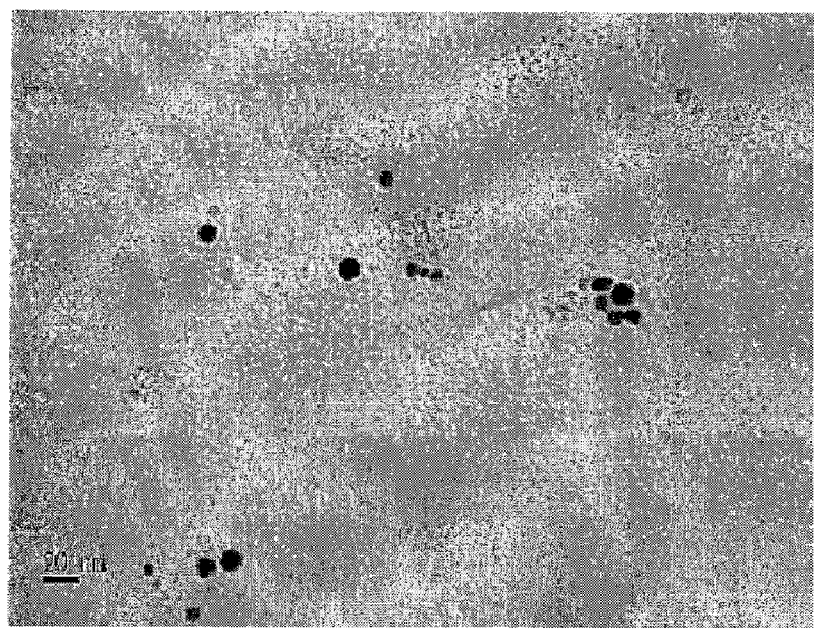
FIG. 2 is an electron microscope photograph illustrating another gold nanoparticle-containing toluene solution of another example of the present invention (Table 1, Example D)
Figure 3:
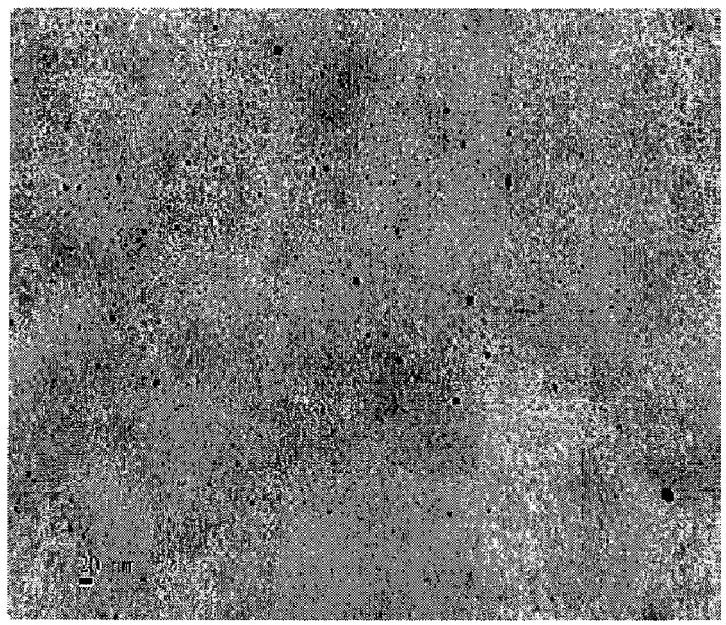
FIG. 3 is an electron microscope photograph illustrating another gold nanoparticle-containing toluene solution of another example of the present invention (Table 1, Example A)

1.5 g of TOPO, 1.5 g of HDA, and 0.2 g of $NaBH_4$ were added into a reaction flask filled with argon under stirring and heated to 190° C. The prepared gold salt-containing TBP solution was added into the reaction flask under stirring, the reaction bottle was kept at 190° C. for thirty minutes and then naturally cooled to 90° C. 20 mL of toluene was added into the reaction flask so that the gold nanoparticles formed were extracted into toluene. The obtained gold nanoparticles were examined by transmission electron microscope. FIG. 1 is an electron microscope photograph illustrating gold nanoparticles obtained from Example E. FIG. 2 is an electron microscope photograph illustrating another gold nanoparticles obtained from Example D. FIG. 3 is an electron microscope photograph illustrating another gold nanoparticles obtained from Example A.

According to the method of this embodiment, toluene was used as a solvent. Since the saturated water content of toluene is quite low, the water and water soluble salts in the toluene solution could be neglected. Therefore the weight percent of gold nanoparticles extracted from the toluene solution could be calculated as follows:

Take Example E for example, the materials used in this example include 1.5 g of TOPO, 1.5 g of HDA, 0.2 g of $NaBH_4$, 0.0346 g of $HAuCl_4 \cdot 3H_2O$, 1.5 mL of TBP (specific weight: 0.81; 1.5*0.81=1.215 g), and 20 mL of toluene (specific weight: 0.866; 20*0.866=17.32 g). The molecular weight of gold was 197 g/mol and the molecular weight of $HAuCl_4 \cdot 3H_2O$ is 394 g/mol. Therefore the quantity of the gold in the toluene solution system was 0.0173 g (0.0346*197/394=0.0173). The total weight of the final toluene solution system was 21.7696 g (1.5+1.5+0.2+0.0346+1.215+17.32=21.7696). The weight percent of TOPO in the final toluene solution system was about 6.9% (1.50/21.7696*100%=6.89%). Thus, the weight percent of gold in the final toluene solution system was about 0.08% (0.0173/21.7696*100%=0.0795%). The weight percent of gold in the final toluene solution system in each experiment is shown in Table 2.

TABLE 2

| | Example | | | | | | | |
|---|---|---|---|---|---|---|---|---|
| | A | B | C | D | E | F | G | H |
| Au (% wt) | 0.07 | 0.09 | 0.08 | 0.07 | 0.08 | 0.08 | 0.08 | 0.08 |

Embodiment II

Preparing the Mixture of Acrylate Monomers and Gold Nanoparticles

In this embodiment, the gold nanoparticle-containing toluene solution from the Examples A-H of Embodiment I was further mixed with acrylate monomers and a photo-polymerization initiator. The acrylate monomers in this embodiment could be at least one of ethoxylated bisphenol A dimethacrylate (Chemical Formula I, available from Sartomer Company, Inc., catalogue No. SR-348), tricyclodecanedimethanol diacrylate (Chemical Formula II, available from Sartomer Company, Inc., catalogue No. SR-833S), and tri(2-hydroxy ethyl) isocyanurate triarylate (Chemical Formula III, available from Sartomer Company, Inc., catalogue No. SR-368). The photo-polymerization initiator in this embodiment could be Irgacure 651 (Chemical Formula IV, available from Ciba Specialty Chemicals) or Irgacure 184 (Chemical Formula V, available from Ciba Specialty Chemicals).

Chemical Formula I

Ethoxylated bisphenol A dimethacrylate, Sartomer SR-348

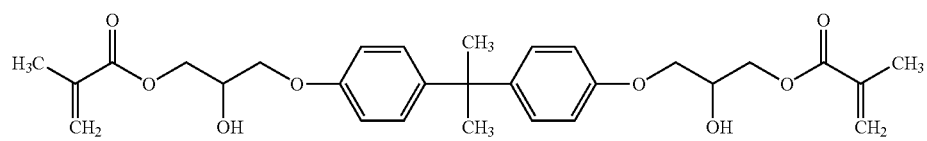

Chemical Formula II

Tricyclodecanedimethanol diacrylate, Sartomer SR-833S

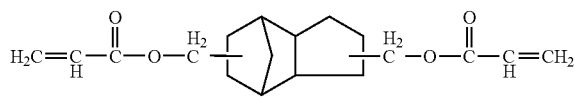

Chemical Formula III

Tri(2-hydroxy ethyl)isocyanurate triarylate, Sartomer SR-368

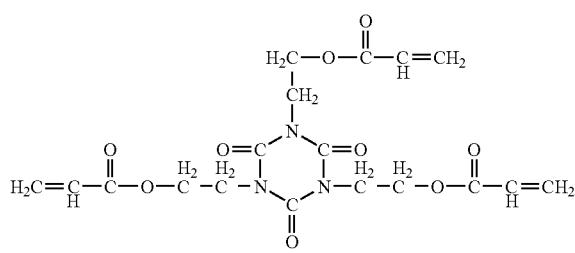

Chemical Formula IV 2,2-Dimethoxy-2-phenyl acetophenone, Irgacure 651

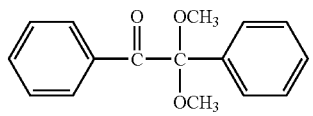

Chemical Formula V 1-hydroxycyclohexyl phenyl ketone, Irgacure 184

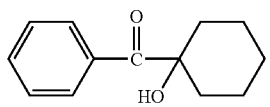

Said acrylate monomers and photo-polymerization initiator were used in the following Experiments I-T herein and should not be constructed as limitations to the present invention. Any monomers and photo-polymerization initiators that could be used to manufacture the photoresist material of the color filter could be mixed with the gold nanoparticles organic solution of the present invention. Said photoresist material forms a color filter after photo-polymerization reaction.

A series of experiments were conducted according to the method of this embodiment. Table 3 shows the quantity of each material used in twelve selected examples (Examples I-T) of this embodiment. In these examples, the gold nanoparticle-containing toluene solution used was respectively selected from the examples of Embodiment I. A sticky red mixture was obtained from each of the twelve examples.

TABLE 3

| Example | Solution Used | Solution (g) | Gold Nanoparticles (mg) | Acrylate Monomers SR-348 (g) | SR-833S (g) | SR-368 (g) | Photo-polymerization Initiator Irg. 651 (g) | Irg. 184 (g) |
|---|---|---|---|---|---|---|---|---|
| I | A | 5.1 | 3.5 | 5.1 | — | — | 0.2 | — |
| J | A | 5.1 | 3.5 | 5.1 | — | — | — | 0.2 |
| K | A | 5.0 | 3.4 | — | 5.0 | — | 0.2 | — |
| L | A | 5.0 | 3.4 | — | 5.0 | — | — | 0.2 |
| M | E | 6.0 | 4.8 | — | 3.0 | — | 0.1 | — |
| N | F | 6.1 | 4.6 | — | 2.0 | — | 0.1 | — |
| O | G | 6.0 | 5.0 | — | 2.0 | — | 0.1 | — |
| P | F | 5.0 | 3.8 | — | 2.0 | — | 0.1 | — |
| Q | F | 4.0 | 3.0 | — | 2.0 | — | 0.1 | — |
| R | H | 5.0 | 3.8 | — | 3.5 | 1.5 | 0.2 | — |
| S | H | 5.0 | 3.8 | — | 2.5 | 2.5 | 0.2 | — |
| T | H | 5.0 | 3.8 | — | 1.5 | 3.5 | 0.2 | — |

Take Example M for example, the gold nanoparticle-containing toluene solution was selected from Example E of the Embodiment I. 6 g of gold nanoparticle-containing toluene solution, 3 g of SR833, and 0.12 g of Irg.651 were used in this example. Therefore the quantity of the gold nanoparticles in this example was 4.8 mg (6.0 (g)*0.08%*1000=4.8 mg).

In Example M, according to the method of this embodiment, 3 g of SR-833S acrylate monomers and 0.1 g of Irgacure 651 photo-polymerization initiator were sequentially added into 6 g of gold nanoparticle-containing toluene solution and then stirred for 30 minutes. Afterward, toluene was removed so that a sticky red mixture was obtained.

Embodiment III

Manufacturing the Thin Film of Red Filter

In this embodiment, the sticky red mixtures from the Examples I-T of Embodiment II were coated over glass substrates. The thickness of the mixture coating is about 1 mm or about 0.25 mm. Both sides of the glass substrate were irradiated by a light source with a wavelength of 365 nm so that a red the thin film could be formed over the glass substrate. Transmission spectra of the thin films manufactured according to this embodiment are shown in FIG. 4, FIG. 5 and FIG. 6.

Figure 4:
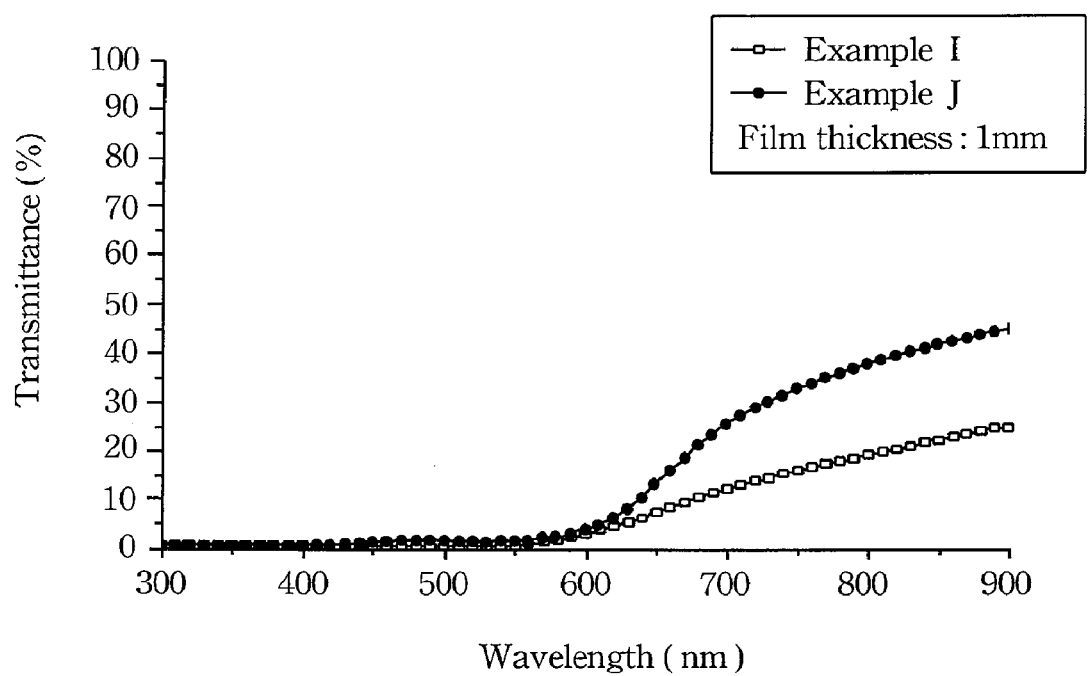
FIG. 4 is transmission spectra of two thin films formed from the mixtures of Example I and Example J of Table 3, wherein the mixtures were respectively coated on a glass substrate, and the coated substrates were exposed to light to form the thin films with a thickness of about 1 mm.

FIG. 4 is transmission spectra of two thin films formed from the mixtures of Example I and Example J of Table 3. The mixtures were respectively coated on a glass substrate The coated substrates were exposed to light to form the thin films with a thickness of about 1 mm. The thin film formed from Example I (the thin film I) and the thin film formed from Example J (the thin film J) only differed in the selection of the photo-polymerization initiator. As could be seen in FIG. 4, the thin film I and the thin film J both containing HDA to have good red color.

Figure 5:
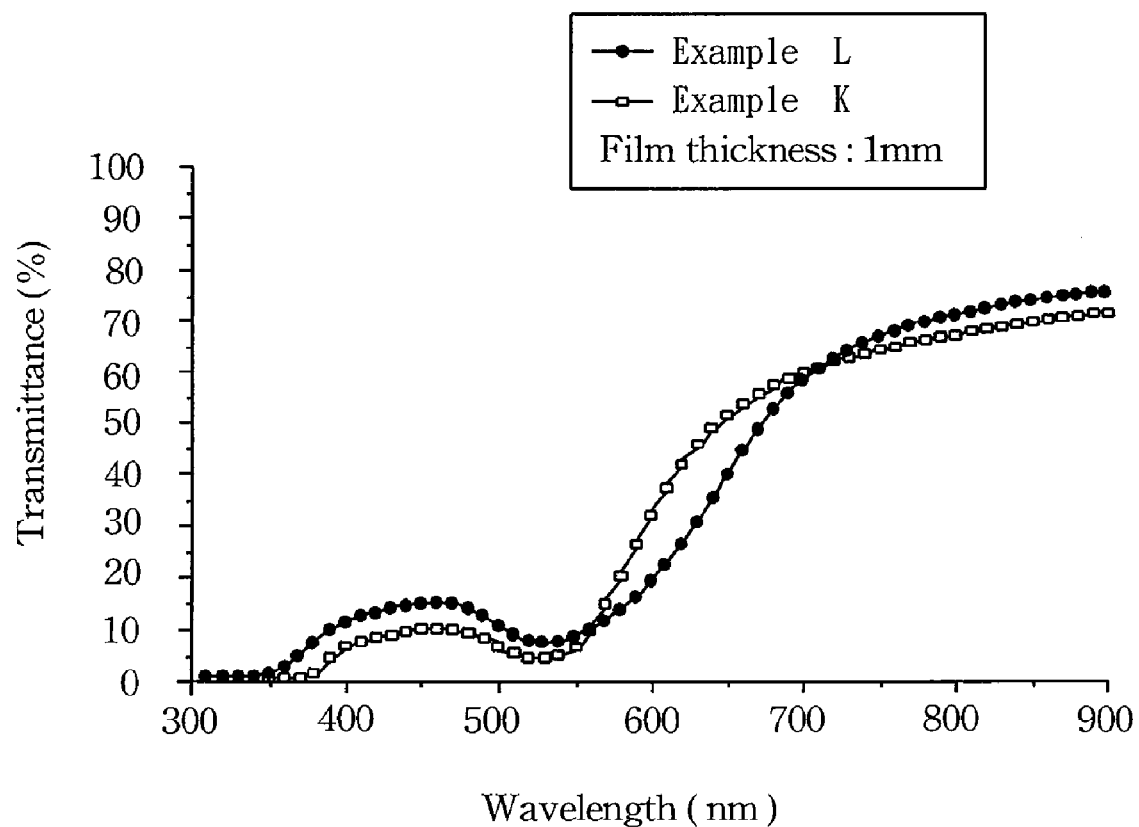
FIG. 5 is transmission spectra of two thin films formed from the mixtures of Example K and Example L of Table 3, wherein the mixtures were respectively coated on a glass substrate, and the coated substrates were exposed to light to form the thin films with a thickness of about 1 mm.
Figure 6:
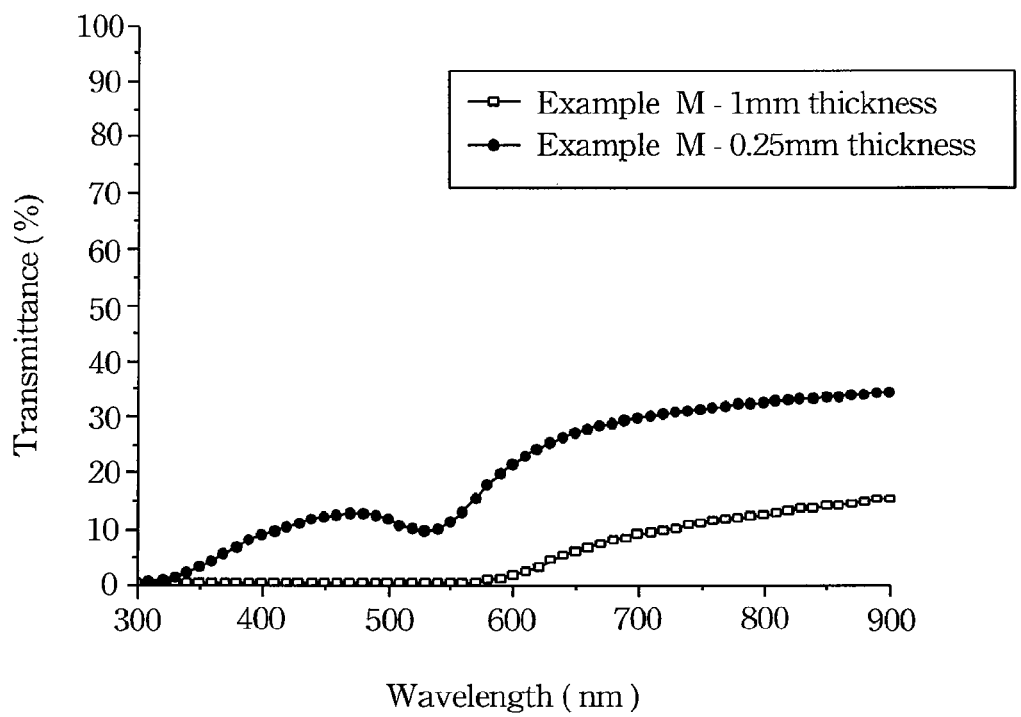
FIG. 6 is transmission spectra of two thin films formed from Example M of Table 3, wherein the mixture were respectively coated on two glass substrates, and the coated substrates were exposed to light to form a thin film with a thickness of about 1 mm and a thin film with a thickness of about 0.25 mm.

FIG. 5 is transmission spectra of two thin films formed from the mixtures of Example K and Example L of Table 3. The mixtures were respectively coated on a glass substrate. The coated substrates were exposed to light to form the thin films with a thickness of about 1 mm. The thin film formed from Example K (the thin film K) and the thin film formed from Example L (the thin film L) only differed in the selection of the photo-polymerization initiator. As could be seen in FIG. 4, the thin film K and the thin film L both containing HDA to have good red color.

Refer to both FIG. 4 and FIG. 5, the acrylic monomers used in the thin film I and the thin film J were different from the acrylic monomers used in the thin film K and the thin film L. The thin film K and the thin film L had higher transmittance for red light (about 640-680 nm) and partial transmittance for the light between about 400-500 nm. Yet, all of the thin films of FIGS. 4 and 5 were visually observed to be of red color.

FIG. 6 is transmission spectra of two thin films formed from the mixture of Example M of Table 3. The mixture was coated over two glass substrates. The coated substrates were exposed to light to form the thin films with a thickness of approximately 1 mm and approximately 0.25 nm. The 1-mm-thick thin film exhibits better light transmission over the 0.25-mm-thick thin film. Yet, both of the 1-mm-thick thin film and the 0.25-mm-thick thin film were visually observed to be of red color.

Embodiment IV

Reducing Gold Ions to Form Gold Nanoparticle Clusters for Blue Photoresist

In this embodiment, all the chemicals used were the same as those used in Embodiment I except that HDA was not used in this embodiment. The following steps were performed so that the gold ions are reduced into gold atoms:

(a) $HAuCl_4 \cdot 3H_2O$ was dissolved in TBP;

(b) TOPO and sodium borohydride ($NaBH_4$) were added into a reaction flask filled with nitrogen or argon under stirring and heated to 190° C.;

(c) the TBP solution from step (a) was added into the reaction flask of step (b) under stirring thereby producing a solution of blue, the reaction flask was kept at 190° C. for tens of minutes and then naturally cooled to 90° C.;

(d) toluene was added into the reaction flask of step (c) so that the gold nanoparticle clusters formed were extracted into toluene.

There were six examples (Examples U-Z) conducted according to the method of this embodiment. The final toluene solution systems obtained according to these examples are all blue. There were two extra control experiments (Control 1 and Control 2 in Table 4) conducted according to the method of Embodiment I that is, HDA was added in the control experiments. Table 4 shows the quantity of each material used in these examples and control experiments. It should be noted that the final toluene solution systems obtained according to Control 1 and Control 2 were both dark red. Thus, it could be inferred that HDA was crucial for determining the property of the gold nanoparticles.

TABLE 4

| Example | TOPO (g) | HDA (g) | NaBH4 (g) | HAuCl4•3H2O (mg) | TBP (mL) | Toluene (mL) |
|---|---|---|---|---|---|---|
| U | 1.5 | 0 | 0.06 | 32.2 | 1.5 | 20 |
| V | 3.0 | 0 | 0.2 | 31.5 | 1.5 | 20 |
| W | 3.0 | 0 | 0.1 | 30.4 | 1.5 | 20 |
| X | 2.0 | 0 | 0.2 | 31.2 | 1.5 | 13 |
| Y | 1.5 | 0 | 0.2 | 31.5 | 1.5 | 10 |
| Z | 1.5 | 0 | 0.05 | 31.3 | 1.5 | 10 |
| Control 1 | 1.5 | 0.05 | 0.1 | 31.6 | 1.5 | 20 |
| Control 2 | 1.5 | 0.5 | 0.06 | 32.0 | 1.5 | 20 |

Figure 7:
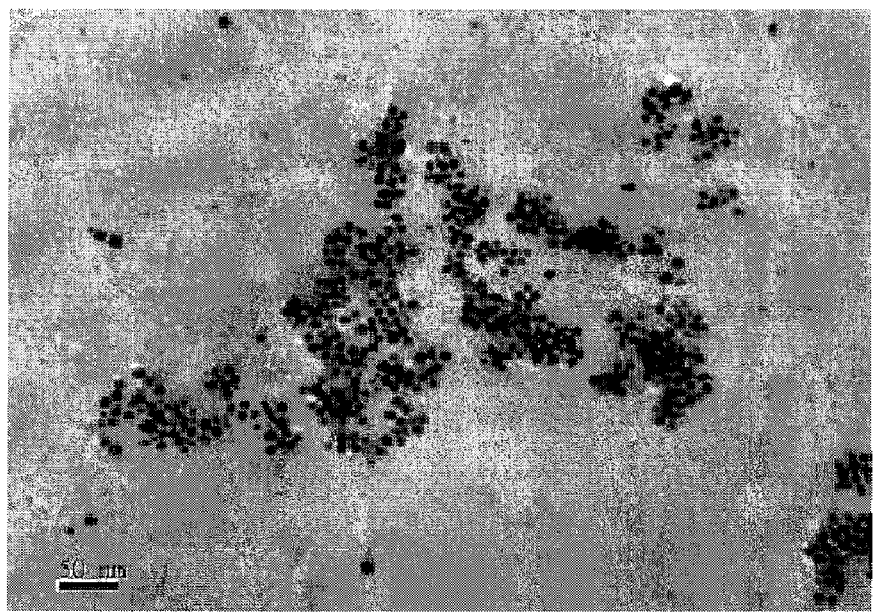
FIG. 7 is an electron microscope photograph illustrating another gold nanoparticle-containing toluene solution of another example of the present invention (Table 4, Example U)

FIG. 7 is an electron microscope photograph illustrating other gold nanoparticles obtained in Example U of the present invention. As could be seen from FIG. 7, the particle size of the gold nanoparticles in Example U did not differ from those in FIG. 1, FIG. 2 and FIG. 3 significantly. However, the gold nanoparticles in Example U aggregated so that gold nanoparticle clusters were formed.

Figure 8:
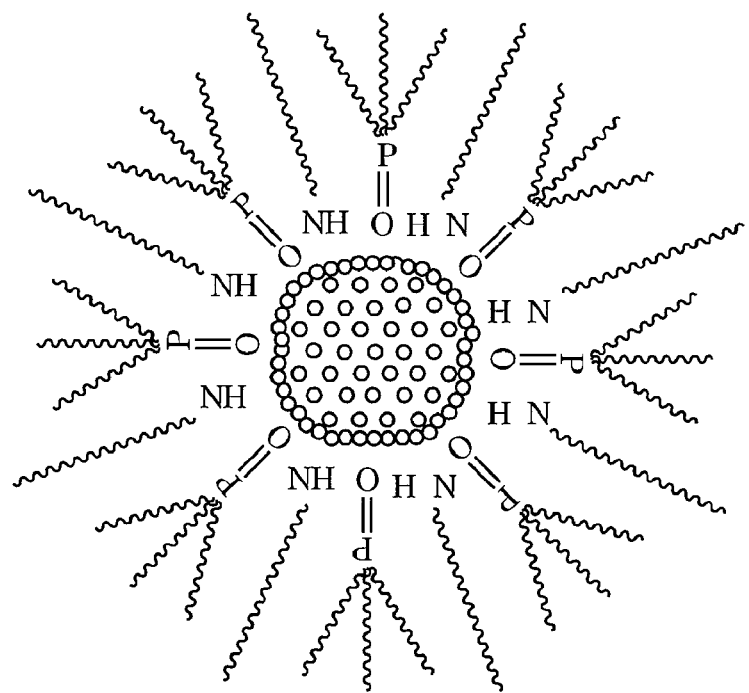
FIG. 8 is a diagram illustrating the arrangement among the first organic surfactant, the second organic surfactant, and the gold nanoparticles according to one embodiment of the present invention.
Figure 9:
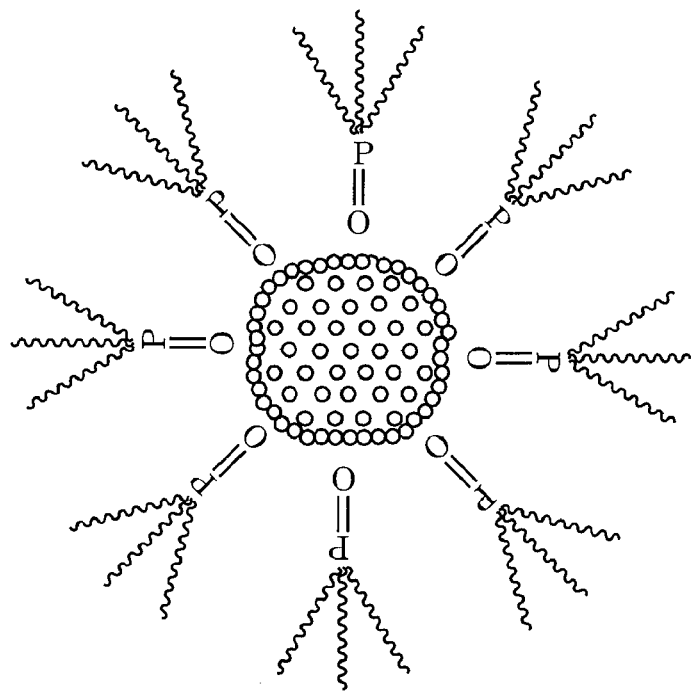
FIG. 9 is a diagram illustrating the arrangement between the organic surfactant and the gold nanoparticles according to another embodiment of the present invention.

FIG. 8 illustrates the arrangement among the first organic surfactant, the second organic surfactant, and the gold nanoparticles according to one embodiment of the present invention. Binding forces exist between the electron clouds of the hetero atoms of the organic surfactants and the surfaces of the gold nanoparticles (clusters), and the linear alkyl groups of the surfactants extend radically outward. Therefore, a reasonable inference is that when two organic surfactants, e.g., tri(linear-alkyl)phosphine oxide (such as TOPO) and linear alkyl amine (such as HDA), are used, hexadecyl long chains alternate with tri-n-octylphosphine oxides thereby preventing the gold nanoparticles from aggregating. Therefore, the size of the gold nanoparticles dispersed within the organic solution or acrylate monomers can be kept in the range between approximately 3 nm and approximately 50 nm thereby exhibiting red color. FIG. 9 is a diagram illustrating the arrangement between the organic surfactant and the gold nanoparticles according to another embodiment of the present invention. When only one kind of organic surfactant, e.g., tri(linear-alkyl)phosphine oxide (such as TOPO), is used, the linear alkyl groups also extend outwardly, but the force keeping the gold nanoparticles from aggregating is weaker. Thereby, the gold nanoparticles can partially aggregate to form gold nanoparticle clusters having a size ranged from approximately 200 nm to approximately 500 nm. The gold nanoparticle clusters can disperse within the organic solution or acrylate monomers thereby exhibiting blue color.

Embodiment V

Manufacturing the Thin Film of Blue Filter

In this embodiment, the organic solvent (toluene) of the gold nanoparticle clusters solution of Embodiment IV was removed so as to obtain powder of gold nanoparticle clusters. TOPO has high boiling point, wherein the boiling point thereof is as high as about 200° C. under 2 mmHg. Therefore, the gold nanoparticle clusters could still disperse within the mixture of acrylate monomers and photo-polymerization initiator effectively so as to obtain a sticky blue mixture.

The sticky blue mixtures were coated over glass substrates. Both sides of the glass substrate were irradiated by a light source having a wavelength of 365 nm so that a blue thin film could be formed over the glass substrate.

From the foregoing, the embodiments of the present invention have following advantages. In accordance with embodiments of the present invention, the photoresist material can exhibit red or blue colors depending on the size of the gold nanoparticles (clusters). In accordance with embodiments of the present invention, gold nanoparticles (clusters) are evenly dispersed within the monomers of the photoresist material by means of the organic surfactant. In accordance with embodiments of the present invention, the quantity of the gold nanoparticles (clusters) in the photoresist material is quite small, and preferably is approximately 0.05-0.5 percent by weight. Thus, the gold nanoparticles (clusters) would barely affect the property of the photoresist itself.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A red photoresist with gold nanoparticles, comprising:
   acrylate monomers;
   a photo-polymerization initiator mixed with the acrylate monomers;
   a plurality of gold nanoparticles having a size from approximately 3 nm to approximately 50 nm, wherein the quantity of the gold nanoparticles is about 0.05-0.5 percent by weight; and
   a first organic surfactant and a second organic surfactant, each molecule of the first organic surfactant and the second organic surfactant having a terminal heteroatom group and at least one linear alkyl group, wherein the linear alkyl group of the first organic surfactant is C6-C12, wherein the linear alkyl group of the second organic surfactant is C12-C20,
   wherein the terminal heteroatom group binds to the surfaces of the gold nanoparticles, and the linear alkyl group disperses the gold nanoparticles within the acrylate monomers and the photo-polymerization initiator.

2. The photoresist of claim 1, wherein the first organic surfactant is tri(linear-alkyl) phosphine oxide and the second organic surfactant is linear alkyl amine.

3. The photoresist of claim 1, wherein the first organic surfactant is tri-n-octylphosphine oxide and the second organic surfactant is hexadecylamine.

4. The photoresist of claim 1, wherein the gold nanoparticles have a size from approximately 3 nm to approximately 30 nm.

5. The photoresist of claim 1, wherein the acrylate monomers are selected from the group consisting of ethoxylated bisphenol dimethacrylate, tricyclodecanedimethanol diacrylate, and tri(2-hydroxy ethyl)isocyanurate triarylate.

6. The photoresist of claim 1, wherein the photo-polymerization initiator is selected from the group consisting of 2,2-Dimethoxy-2-phenyl acetophenone and 1-hydroxycyclohexyl phenyl ketone.

7. A blue photoresist with gold nanoparticles, comprising:
   acrylate monomers;
   a photo-polymerization initiator mixed with the acrylate monomers;
   a plurality of gold nanoparticle clusters having a size from approximately 200 nm to approximately 500 nm; and
   the blue photoresist consisting essentially of an organic surfactant, each molecule of the organic surfactant having a terminal heteroatom group and three linear alkyl groups, wherein the linear alkyl group of the organic surfactant is C6-C12;
   wherein the terminal heteroatom group binds to the surfaces of the gold nanoparticle clusters, and the linear alkyl groups disperse the gold nano-particle clusters in the acrylate monomers and the photo-polymerization initiator.

8. The photoresist of claim 7, wherein the organic surfactant is tri(linear-alkyl) phosphine oxide.

9. The photoresist of claim 8, wherein the organic surfactant is tri-n-octylphosphine oxide.

10. The photoresist of claim 7, wherein the quantity of the gold nanoparticle clusters is 0.05-0.5 percent by weight.

11. A red filter with gold nanoparticles, comprising:
    polyacrylate;
    a plurality of gold nanoparticles, the gold nanoparticles have a size from approximately 3-50 nm, wherein the quantity of the gold nanoparticles is about 0.05-0.5 percent by weight; and
    a first organic surfactant and a second organic surfactant, each molecule of the first organic surfactant and the second organic surfactant having a terminal heteroatom group and at least one linear alkyl group,
    wherein the linear alkyl group of the first organic surfactant is C6-C12, wherein the linear alkyl group of the second organic surfactant is C12-C20,
    wherein the terminal heteroatom group binds to the surfaces of the gold nanoparticles, and the linear alkyl group disperses the gold nanoparticles within the polyacrylate.

12. The filter of claim 11, wherein the first organic surfactant is tri(linear-alkyl) phosphine oxide and the second organic surfactant is linear alkyl amine.

13. The filter of claim 11, wherein the first organic surfactant is tri-n-octylphosphine oxide, and the second organic surfactant is hexadecylamine.

14. The filter of claim 11, wherein the gold nanoparticles have a size from approximately 3 nm to approximately 30 nm.

15. The filter of claim 11, wherein the polyacrylate is selected from the group consisting of bisphenol dimethacrylate, tricyclodecanedimethanol diacrylate, and tri(2-hydroxy ethyl)isocyanurate triarylate.

16. A blue filter with gold nanoparticles, comprising:
    polyacrylate;
    a plurality of gold nanoparticle clusters having a size of about 200 nm to approximately 500 nm; and the blue filter consisting essentially of an organic surfactant, each molecule of the organic surfactant having a terminal heteroatom group and three linear alkyl groups;

wherein the terminal heteroatom group binds to the surfaces of the gold nanoparticle clusters, and the linear alkyl groups disperse the gold nano-particle clusters in the polyacrylate, wherein the linear alkyl group of the organic surfactant is C6-C12.

17. The filte of claim 16, wherein the organic surfactant is tri(linear-alkyl)phosphine oxide.

18. The filter of claim 17, wherein the organic surfactant is tri-n-octylphosphine oxide.

19. The filter of claim 16, wherein the quantity of the gold nanoparticle clusters is 0.05-0.5 percent by weight.

* * * * *